United States Patent [19]

Pagel et al.

[11] 4,198,936
[45] Apr. 22, 1980

[54] SYSTEM TO CONTROL THE ON-OFF TIME OF A PULSE TRAIN OF VARIABLE FREQUENCY, PARTICULARLY THE DWELL TIME OF IGNITION SIGNALS FOR AN INTERNAL COMBUSTION ENGINE

[75] Inventors: Ernst O. Pagel, Sachsenheim; Wolfgang Borst, Schwieberdingen, both of Fed. Rep. of Germany

[73] Assignee: Robert Bosch GmbH, Stuttgart, Fed. Rep. of Germany

[21] Appl. No.: 888,194

[22] Filed: Mar. 20, 1978

[30] Foreign Application Priority Data

Mar. 18, 1977 [DE] Fed. Rep. of Germany ....... 2711894

[51] Int. Cl.² ........................... F02P 5/04; F02P 1/00; G06F 7/385
[52] U.S. Cl. ........................... 123/117 R; 123/117 D; 123/148 E; 235/92 TF
[58] Field of Search ............ 123/117 R, 117 D, 148 E, 123/146.5 A; 235/92 PE, 92 TF, 92 T; 323/DIG. 1

[56] References Cited

U.S. PATENT DOCUMENTS

| 3,892,219 | 7/1975 | Preiser et al. | 123/148 E |
|---|---|---|---|
| 3,908,616 | 9/1975 | Sasayama | 123/117 D |
| 4,018,202 | 4/1977 | Gartner | 123/117 D |
| 4,041,912 | 8/1977 | Sessions | 123/148 E |
| 4,083,347 | 4/1978 | Gräther et al. | 123/146.5 A |
| 4,095,165 | 6/1978 | Boros | 323/DIG. 1 |
| 4,099,507 | 7/1978 | Pagel et al. | 123/148 E |
| 4,106,447 | 8/1978 | West | 123/117 R |

FOREIGN PATENT DOCUMENTS 2701968 7/1978 Fed. Rep. of Germany ...... 123/117 R

Primary Examiner—Charles J. Myhre
Assistant Examiner—P. S. Lall
Attorney, Agent, or Firm—Frishauf, Holtz, Goodman & Woodward

[57] ABSTRACT

A pulse train of a first frequency is generated, for example representative of speed of an internal combustion engine, and counted in a counter in a first counting cycle until the counter reaches a predetermined count number, the counter then being reset; a second frequency signal, for example a multiplied frequency derived from the first is then applied to the counter during a second count cycle, the counter stopping to count when current flow through the ignition coil of a predetermined level is sensed, and establishing a count number from which the counter can start counting at the next subsequent first cycle. The ON time of ignition current flow is controlled to commence at the beginning of the second count cycle, terminating at the ignition instant, as controlled by an ignition time control arrangement.

10 Claims, 2 Drawing Figures

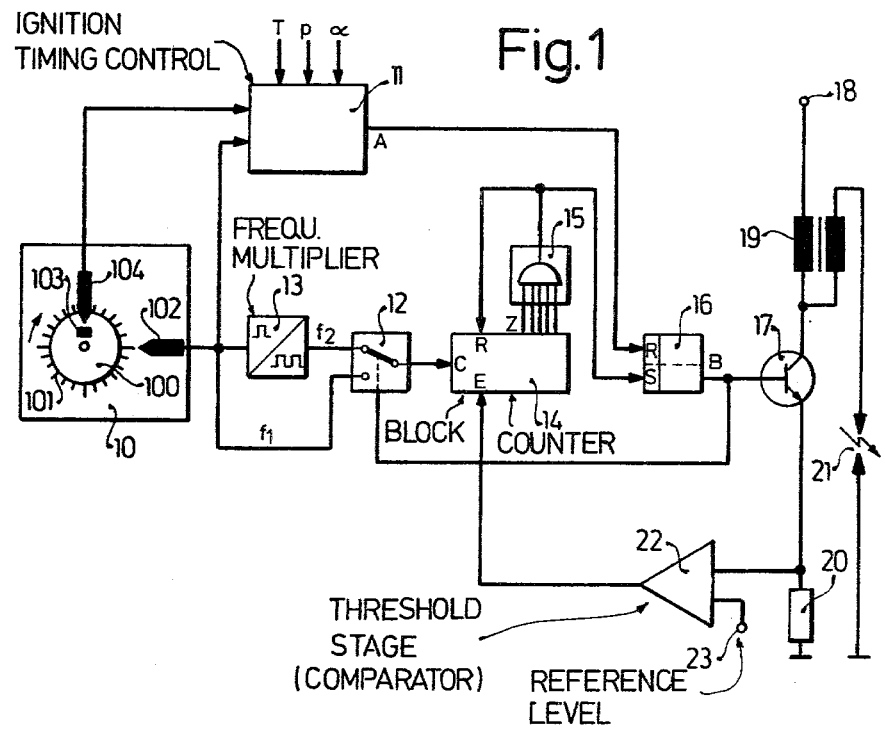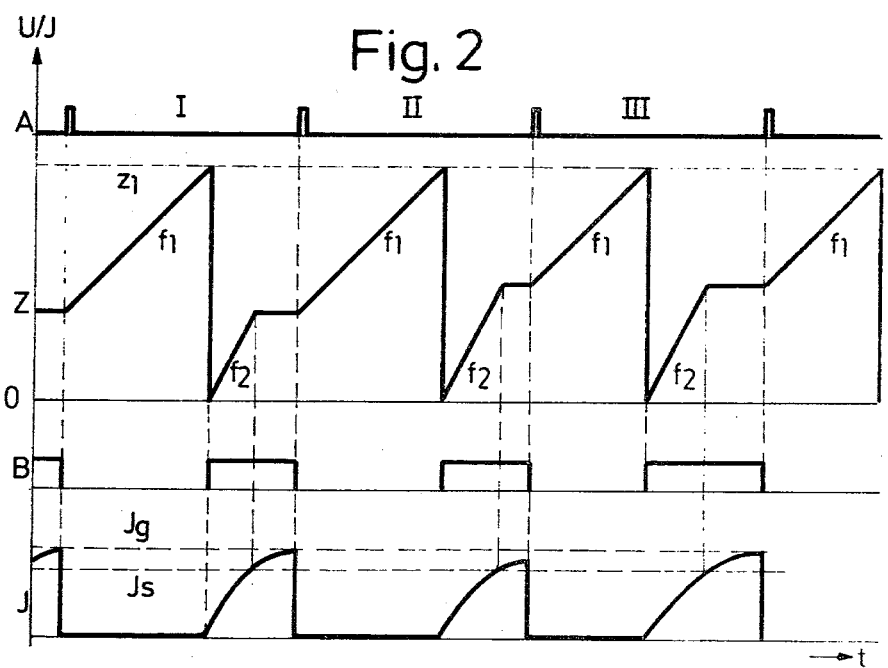

SYSTEM TO CONTROL THE ON-OFF TIME OF A PULSE TRAIN OF VARIABLE FREQUENCY, PARTICULARLY THE DWELL TIME OF IGNITION SIGNALS FOR AN INTERNAL COMBUSTION ENGINE

Reference to related publications: German disclosure document DT-OS Nos. 25 23 388 corresponding to U.S. Application 669,814 (Mar. 24, 1976) Pagel and Borst, now U.S. Pat. No. 4,099,507; 25 04 843 corresponding to U.S. Application 650,971 (Jan. 21, 1976) Gorille et al, now U.S. Pat. No. 4,063,539.

The present invention relates to a system to control the duty cycle, or ON-OFF time relationship of a pulse train of variable frequency, in which the ON time is dependent on a variable parameter, and more particularly to an ignition system for an internal combustion engine having an ignition coil in which duration of current flow through the primary of the coil is dependent on a predetermined level of current flow therethrough and in dependence on operating speed of the engine.

BACKGROUND AND PRIOR ART

Various types of control systems to control the duty cycle or the relationship of the ON to OFF time of pulses in a pulse train of variable frequency have been proposed. Several of such systems utilize a counter to which pulse trains of different frequencies are applied. One such arrangement is described in U.S. Pat. No. 4,099,507, by the inventors hereof, assigned to the assignee of this application which discloses a counter having two different counting frequencies applied thereto, both of which are generated by a rotating pulse signal source coupled to the crank shaft of an internal combustion engine. The duty cycle, or the relative duration of ON-TIME to the overall cycle time, or to the OFF time is determined by a timing circuit. Use of such a system in ignition systems for internal combustion engines has disadvantages when the engines are installed in automotive vehicles, since the supply voltage to the system can vary widely. If the supply voltage of the current delivered to the ignition coil changes over wide values, the energy stored by the ignition coil will likewise change, leading to ignition pulses of variable energy content. It is thus necessary to arrange the timing period for the closed, or ON time or dwell time of the switch in series with the primary of the ignition coil such that sufficient energy will stored even under minimum supply voltage conditions to insure that a spark of sufficient energy will be available to provide ignition of the fuel-air mixture in the cylinder. Upon a rise of the supply voltage, the current through the primary of the ignition coil will load the primary circuit and the coil to an unnecessary extent, resulting in undesirably high losses in the coil and the associated circuit which, at extremely high excessive primary voltages, may even lead to damage or destruction of circuit elements in the primary circuit of the ignition coil. To prevent such possible damage it is thus necessary to over design the ignition coil and the associated circuit elements which introduces unnecessary costs.

THE INVENTION

It is an object to provide a control system in which the ON time is matched to the variable parameter, for example current flow through the ignition coil of an internal combustion engine, and, when applied to the ignition system, to so control the ON time that an optimum of current flow will be provided which stores just the right amount of ignition energy in the coil. The storage of energy thus will become independent of supply voltage and the eventual ignition spark to be derived from the coil will have an energy content which is essentially independent of supply voltage. The losses in the circuits can be minimized and an output stage can be used which operates strictly in an ON-OFF mode, thus additionally contributing to the efficiency of operation of the system.

Briefly, a counter is provided to which a first frequency is supplied, for example derived as a function of the speed of revolution of the internal combustion engine. The counter will then count at the rate of that first frequency during a first counting cycle, starting from a count position which is determined by a second count cycle, as will appear. When the counter has reached a predetermined count number, it is reset to a predetermined count state, preferably reset to zero and the second count cycle, based on a second frequency will commence. The second frequency, in accordance with an embodiment of the invention can be a multiple of the first frequency. When the variable parameter, typically current flow through the ignition coil has reached a predetermined value, for example, when the current has reached a value which can be sensed in a threshold circuit, the second count cycle is interrupted and the count number stored to form the base, or commencement of the count for the subsequent first counting cycle for a subsequent signal, typically to control a subsequent ignition event. The timing of the ignition event itself is controlled by an ignition timing circuit and occurs after the current through the primary of the coil has reached a predetermined or sensing threshold level.

When applied to the control of a spark in an internal combustion engine, and particularly in an automotive type internal combustion engine, the pulse train is derived from an incremental-type transducer system which generates a counting frequency dependent on the speed of the engine, the second frequency being then obtained by a frequency multiplier connected to the output of the transducer arrangement, and in accordance with a preferred embodiment, the frequency multiplier is a frequency doubler.

DRAWING, ILLUSTRATING A PREFERRED EXAMPLE

FIG. 1 is a general schematic block diagram of the system in accordance with the invention and FIG. 2 is a pulse and timing diagram used in connection with the explanation of the operation of the system.

A transducer arrangement 10 (FIG. 1) provides output pulses of a frequency f1. A star wheel, or gear disc 100 has teeth 101 circumferentially located thereon, in equal distance from each other. These teeth are scanned by a first scanning transducer 102. The teeth are ferromagnetic and the transducer 102 is an inductive element which, as the teeth pass the inductive element change the inductivity therein, so that an output signal can be derived from the inductive element 102. Other types of transducers can be used; for example, markers can be scanned by other types of scanning transducers. The disc may be magnetized, in radial strips; or it may be apertured and the apertures scanned by an optical transducer system. The disc 100, additionally, has a reference marker 103 which is associated with a reference transducer 104. Dependent on the number of the desired ignition events for each revolution of the disc 100, that is, proportional to the numbers of cylinders of an internal combustion engine, a number of such reference markers 103 may be provided, or additional reference signals can be electronically generated based on a single marker 103. A six cylinder internal combustion engine would, for example, have three reference markers 103, offset with respect to each other by 120°. The reference marker 103 can, of course, be placed on another disc and rotating in synchronism with disc 100. Wave shaping circuits are preferably connected to the outputs of the transducers 102, 104. Such wave shaping circuits are not shown and well known; in the preferred form, they would include a Schmitt trigger, providing square-wave output signals.

Both of the transducers 102, 104 are connected to an ignition timing control stage 11, which includes calculating elements which calculate the exact timing of the ignition event in dependence on input signals. One of the input signals, the one derived from transducer 102 is representative of engine speed. Additional input signals, as schematically shown by arrows T, p and $\alpha$ are applied to stage 11, representative, respectively, of temperature, induction type vacuum, and throttle position. Other input signals may also be applied to stage 11, for example representative of an operating condition, e.g. whether the engine is under starting condition, exhaust gas composition, or the like. Changing the ignition timing in accordance with input signals derived form operating parameters of the engine, and providing timing advance, or retardation is well kwown; a typical ignition timing control stage is disclosed in German disclosure document DT-OS No. 25 04 843.

Transducer 102 is connected to one terminal of a transfer switch 12. It is, additionally, connected to a frequency multiplier stage 13, preferably a frequency doubler, the output of which is a frequency f2 connected to the other terminal of transfer switch 12. The transfer terminal of switch 12 itself is connected to the clock, or counting input of a digital counter 14. The transfer switch 12, additionally, has a control input which controls the switching state of the switch 12. Switch 12 is shown as a mechanical switch although, of course, it can be an electronic switch.

The count outputs from counter 14 are connected to a decoding stage 15 which decodes a predetermined count number, or count value Z1 of the counter. The output of decoding stage 15 is connected to the reset input of counter 14 and additional to the SET input of flip-flop (FF) 16. The decoding stage 15 can be constructed as a gate arrangement, in which, for example, an AND gate has signals applied from respective outputs of counter 14 corresponding to the predetermined count value, in direct, that is, positive or in negative, that is inverted form. Such decoding stages are well known. When the respective count value Z1 (FIG. 2) of counter 14 is reached, the stage 15 provides an output signal.

The output of stage 11 is connected to the RESET input of FF16. The output of FF16 controls a switch 17. Switch 17, preferably, is a controlled semiconductor switch, such as a transistor, or a thyristor, operating in ON-OFF mode. The output of FF16 is additionally connected to the control input of transfer switch 12, controlling the switching position of switch 12.

A positive supply terminal 18, connected, for example to the battery of an automotive vehicle is connected to the primary winding of an ignition coil 19 and then, serially, through switch 17 to a current measuring resistor 20 and then to the ground, negative, or chassis terminal, of the battery. The resistor 20 functions as a current measuring element. Use of a resistor is preferred since this is the simplest form. The secondary of ignition coil 19 is connected to a sparkplug 21 and if the system is used with multi-cylinder internal combustion engines, a distributor is interposed between the secondary of the ignition coil 19 and a plurality of sparkplugs, as is well known. The junction between switch 17 and current measuring resistor 20 is connected to a threshold sensing stage 22, preferably in form of an operational amplifier connected as a comparator having a reference level input connection 23. The output of the threshold stage 22 is connected to a blocking input E of the counter 14 which, when a signal appears thereat, stops or inhibits further counting of the counter 14. The reference level terminal 23 provides a signal which is representative of a desired current flow $F_s$ through the primary of coil 19.

Operation, with reference to FIG. 2: for ease of explanation, the terminology usual in digital technology will be used, in which a 1-signal corresponds to a signal at approximately the level of the positive terminal 18, and a 0-signal corresponds to a voltage level of approximately ground, or chassis level.

As will appear below, the counter 14 starts to count from a count number Z determined during the preceding ignition cycle. Each ignition cycle includes two counting cycles of the counter. Pulses from transducer 102 at frequency f1 are connected through the transfer switch 12, which, initially, is in the "down" position (opposite to that shown in FIG. 1). The counter 14 will thus count at the rate of the frequency f1. When the counter has reached a predetermined count value, as determined by the decoding stage 15, decoding stage 15 will provide a signal. The signal from decoding stage 15 has two effects: (1) it resets the counter 14 over the reset terminal R and (2) it sets the FF16. Setting of FF16 provides an output signal B (FIG. 2) which has two effects: (1) The transfer switch 12 is operated to change over to the position shown in FIG. 1, thus transferring pulses at the frequency f2 to the count input C of the counter 14; and the switch 17 is controlled to the ON state so that current can flow from the positive terminal 18 of the source through the primary of the ignition coil, the closed switch 17 and the current measuring element, typically the resistor 20. Counting frequency f2, in the preferred embodiment is twice the frequency of f1, and thus the slope of the count rate, as illustrated in the diagram of FIG. 2 is twice that of the frequency f1. The current J flowing through the primary of ignition coil 19 and the current measuring resistor 20 is applied to the threshold stage 22 as a voltage level. When the current J exceeds a command value Js, as determined by the reference level at terminal 23, threshold stage 22 provides an output signal to the blocking terminal E of counter 14, inhibiting further counting of the counter. The counter 14 will retain its then obtaining count value until an ignition command signal A appears at the output of the ignition control stage 11. The ignition command signal A resets the FF16 which causes abrupt opening of switch 17, that is, blocking of current flow through the primary circuit resulting in a sharp voltage pulse across the spark gap 21. The interruption of current flow through the series circuit 18-19-17-20 also causes threshold stage 22 to become inactive so that the blocking or inhibiting signal at terminal E of counter 14 is removed. Further, the change-over of FF16 transfers the transfer switch 12 to the other position, that is, to the one not shown in FIG. 1 so that pulses at frequency f1 will be transmitted from the transducer 102 to the counter 14. A new ignition event cycle can then commence.

The illustration of FIG. 2 utilizes the preferred case in which the frequency f2 is twice that of the frequency f1. In such an arrangement, the command current value Js must be so set that this current is reached during half of the desired total time during which current flow through the primary of the ignition coil 19. If the relationship of frequencies f2 to f1 is different then the command current value Js must be suitable changed.

The second ignition cycle (the third counting cycle for the counter) in FIG. 2 illustrates the case in which the current rise in the primary is slower than normal, for example due to a drop in the supply voltage at terminal 18. The cause for such a drop of supply voltage could be due to various reasons, for example a sudden load placed on the battery, a change in resistance values due to temperature changes, or aging. The decrease in the rate of current rise can be due to other causes besides change in supply voltage and, for example, also include changes in the operating characteristics of components, temperature, and the like. The effect will be the same as the change in supply voltage. Basically, if the command current value Js is reached at a later time than previously explained, the counter 14 will count at the second rate f2 to the higher count state than during the first counting cycle—compare the ignition cycles I and II in FIG. 2. This causes a decrease of the time duration during which the count state in counter 14 remains unchanged. A limiting current Jg, which is the upper limit value of current flow through the ignition coil under desired conditions, and at which, normally, ignition is to be triggered is not then reached. Yet, such a change is corrected in the next subsequent ignition cycle III, during which a longer signal B, that is the longer SET time of FF16 is obtained since the counting of the counter 14 starts at a higher counting level Z—compare the level of the horizontal portions of cycle I and II. The extended signal B thus permits current flow through coil 19 which, since the coil is highly inductive, is nonlinear, for a longer period of time so that the limiting current value Jg is again reached. The command current value Js is set at the lower level than the limiting current value Jg at which ignition is to be normally initiated. The circuit is self correcting, or adaptive with respect to external conditions, such as low battery voltage, aging of components, temperature and the like.

Various changes and modifications may be made within the scope of the inventive concept.

We claim:

1. System to control the ON-OFF time of a pulse train of variable frequency in which the ON time is dependent on a variable parameter, comprising
    means (10) generating a variable first frequency (f1) as a function of the frequency of said pulse train;
    means (10, 13) generating a second variable frequency (f2) differing from said first frequency;
    a counter (14);
    controlled transfer switching means (12) connected to apply the first frequency (f1) to the counter 14 to thereby commence a first counting cycle during which the counter counts at the rate of the first frequency to a predetermined count value (Z1) and, selectively and when so controlled, to apply the second (f2) to the counter to thereby commence a second count cycle;
    means (15, 16) recognizing when the counter reaches said predetermined count value (Z1) and setting said counter to a predetermined count state (zero) as a starting count for the second count cycle, and additionally controlling said control transfer switching means to apply said second frequency (f2) to the counter;
    means (20, 22, 23) responsive to said variable parameter and providing an output signal when said parameter has reached a predetermined level and controlling said counter during its second count cycle to then stop counting;
    and switch means (17) responsive to the time period between the instant when the counter (14) has reached said predetermined count state (ZERO) and commencement of said first counting cycle and controlling the ON time of said pulse based on said time period, whereby
    the ON time will be controlled as the function of the parameter and the frequency of the pulse train.

2. In an ignition system for an internal combustion engine having a ignition coil (19),
    a system to control the ON-OFF time of current flow through the primary of the ignition coil, in which the ON time is dependent on a predetermined level of current flowing through said primary of the coil comprising
    means generating a first variable frequency (f1) as a function of engine speed;
    means (10, 13) generating a second frequency (f2) higher than said first frequency;
    a counter (14);
    control transfer switching means (12) connected to apply the first frequency (f1) to the counter (14) to thereby commence a first counting cycle and cause the counter to count at the rate of the first frequency to a predetermined count value (Z1) and, selectively, and when so controlled, connecting and applying the second frequency (f2) to the counter (14) to thereby commence a second counting cycle;
    decode means (15, 16) recognizing when said counter reaches said predetermined count value (Z1) and setting said counter to a predetermined count state (ZERO) and additionally controlling said controlled transfer switching means (12) to apply said second, higher frequency (f2) to the counter to cause the counter to count at the rate of said second, higher frequency;
    current flow responsive means (20, 22, 23) responsive to the level of current flow in the primary of said ignition coil and connected to said counter to inhibit counting of the counter and thus to terminate the second count cycle;
    means (11) generating an ignition trigger signal (A);
    and interrupter switch means (17) connected to said counter (17) closing as a function of the time period after the counter (14) has reached said predetermined count state (ZERO), the ignition trigger signal generating means (11) generating said trigger signal to then interrupt current flow through the primary of the ignition coil, whereby the ON time of said interrupter switch means will be controlled as a function of the speed of the engine and current flow through the ignition coil to provide for closing of said interrupter switch means for a period of time essentially independent of the speed of the engine and will be self adaptive with respect to external operating conditions and self regulating in dependence on the level of current flow through the primary of the ignition coil.

3. System according to claim 2 wherein the current flow responsive means includes a resistor (20) serially connected with the primary of the ignition coil (19), and a threshold stage (22) connected to sense the voltage drop across the resistor and providing an output signal when the current flow through said resistor (20) has reached said predetermined level.

4. System according to claims 1 or 2 wherein the means generating the first frequency (f1) comprises in rotary speed transducer (10).

5. System according to claim 2 wherein the means generating the ignition trigger signal (A) comprises an ignition timing control stage (11) providing a timed ignition output pulse in accordance with inputs representative of engine operating characteristics.

6. System according to claims 1 or 2 wherein the means generating the second frequency comprises a frequency transformation stage (11) connected to the means (10) generating the first frequency (f1) to form the second frequency as a transformed pulse train as a function of the first frequency.

7. System according to claim 2 wherein the means generating said second frequency (f2) comprises a frequency multiplier (13) connected to the means (10) generating the first frequency to provide said second frequency (f2) as a multiple of the first frequency (f1).

8. System according to claim 2 wherein the count value recognition means (15, 16) includes a decode stage (15) and a bistable stage (16) which changes over from a second state to a first state when the decode stage (15) has recognized said predetermined count value (Z1);

and wherein said bistable stage (16) is connected to and controlled by said ignition trigger signal generating means (11) to change to said first state when an ignition trigger signal is derived from said trigger signal generating means, said bistable stage, when in said first state, controlling said control transfer switching means (12) to apply the first frequency (f1) to the counter and, when in said second state, to control said control transfer switching means (12) to apply the second frequency (f2) to the counter.

9. System according to claim 8 wherein the interrupter switch means (17) is controlled to ON state, permitting current flow through the primary of said ignition coil when said bistable stage (16) is in said second or SET state.

10. System according to claim 2 further including a controlled switch (16), the switching state of which is jointly controlled by said count signal recognition means (15) and said ignition trigger signal generating means (11), said switch (16) controlling: (a) closing of said interrupter switch means (17) to permit current to flow through the primary of the ignition coil (19) and to apply the second frequency (f2) to said counter when the count value recognition means (15) has recognized that said counter has counted to said predetermined count value (Z1), and (b) controlling opening of said interrupter switch means (17) under command of said ignition trigger signal generating means (11) and additionally controlling the control transfer switching means (12) to apply the first frequency (f1) to the counter (14) to thereby cause the counter to start counting from the count level which it had achieved when it had been counting at the rate of said second frequency (f2) until controlled to stop counting by said current flow responsive means (20, 22, 23).

* * * * *